(12) United States Patent
Tkaczyk et al.

(10) Patent No.: US 11,860,295 B2
(45) Date of Patent: Jan. 2, 2024

(54) ENCLOSURE FOR ELECTRONICS (71) Applicant: Aptiv Technologies Limited, St. Michael (BB)

(72) Inventors: Grzegorz Tkaczyk, Cracow (PL); Maciej Adamczyk, Cracow (PL)

(73) Assignee: Aptiv Technologies Limited, St. Michael (BB)

( * ) Notice: Subject to any disclaimer, the term of this patent is extended or adjusted under 35 U.S.C. 154(b) by 215 days.

(21) Appl. No.: 17/473,744

(22) Filed: Sep. 13, 2021

(65) Prior Publication Data
US 2022/0099792 A1 Mar. 31, 2022

(30) Foreign Application Priority Data
Sep. 28, 2020 (EP) ..................................... 20198650

(51) Int. Cl.
*G01S 7/02* (2006.01)
*B60R 16/023* (2006.01)

(52) U.S. Cl.
CPC .......... *G01S 7/028* (2021.05); *B60R 16/0239* (2013.01)

(58) Field of Classification Search
CPC ... G01S 7/028; B60R 16/0239; H05K 5/0056; H05K 5/068
See application file for complete search history.

(56) References Cited

U.S. PATENT DOCUMENTS

2015/0338299 A1* 11/2015 Eckert ................ G01L 7/08
73/730
2017/0013741 A1 1/2017 Ding et al.

FOREIGN PATENT DOCUMENTS

DE 102006053114 5/2008
GB 2307750 6/1997

OTHER PUBLICATIONS

"Extended European Search Report", EP Application No. 20198650. 2, dated May 7, 2021, 9 pages.

* cited by examiner

Primary Examiner — Jacob M Amick
Assistant Examiner — Charles J Brauch
(74) Attorney, Agent, or Firm — Sawtooth Patent Group PLLC (57) ABSTRACT

An enclosure for electronics comprises a shell. The shell defines an exterior of the enclosure and accommodated a main chamber inside the shell. The enclosure comprises a partition defining a relief chamber extending inwardly of the shell. The partition has a relief aperture communicating between the relief chamber and the main chamber. The partition has a gas-permeable barrier membrane arranged to cover the aperture. The shell has an opening communicating between the relief chamber and the exterior of the enclosure. The enclosure is suitable for vehicle-mounted radar sensor electronics. The enclosure may provide IP6K6K environmental sealing.

20 Claims, 7 Drawing Sheets

ENCLOSURE FOR ELECTRONICS

CROSS-REFERENCE TO RELATED APPLICATION

This application claims priority to European Patent Application Number 20198650.2, filed Sep. 28, 2020, the disclosure of which is hereby incorporated by reference in its entirety herein.

TECHNICAL BACKGROUND

The present disclosure relates to enclosures for electronics, and in particular those which provide an environmentally-protected chamber which is resistant to ingress of liquid and/or dust. Such enclosures may have applications in the protection of automotive electronics, and in particular the protection of sensor modules, such as radar sensor modules, for autonomous or semi-autonomous vehicles.

In many fields of application, it is necessary to protect sensitive parts such as electronic components from damaging environments. For example, in the automotive field, engine control units, infotainment modules, and other control and or interface modules may need to be located at a location which is inadequately protected from, for example, liquid and/or dust ingress.

As just one example, in autonomous or semi-autonomous vehicles, it is conventional to arrange sensor modules at or close to an external surface of the vehicle to send and/or receive signals, such as radar signals, from the environment around the vehicle. Such modules may come into contact with hostile environmental conditions more readily than other modules, for example by the application of jet-sprayed liquid, such as a mixture of water and cleaning agents, during a cleaning operation performed on the vehicle.

Therefore, it is desirable that unit containing such sensitive parts are environmentally-sealed to at least, for example, the IP 6K6K rating according to IEC standard 60529, which provides resistance to a high-pressure jet of liquid for an extended period.

However, such modules also are required to operate within a very wide temperature range, typically between −40° C. and 85° C., both due to ambient environmental factors such as cold air temperatures or direct solar irradiation, and due to mounting of such modules in proximity to heat-generating or heat-dispersing automotive components such as internal combustion engines, electric motors, exhaust assemblies, heat exchangers and the like. When closed and sealed units are exposed to changes in temperature, the air inside such units will undergo a change in pressure, which, if not relieved, can lead to damage of the enclosed electronics or of the sealed enclosure of the unit.

Therefore, it has been proposed to provide a pressure-relief aperture communicating between the exterior and interior of the unit in order to allow for changes in temperature without increasing or decreasing the internal pressure of the unit. The provision of such a relief aperture, however, breaks the overall sealing of the unit by introducing a route through which liquid and dust can enter the unit. The provision of such a relief aperture may therefore compromise the compliance with environmental sealing rating such as IP 6K6K.

In one proposal, a conventional breathable, that is, gas-permeable but liquid-impermeable, membrane such as GORE™ membrane, is provided to cover the aperture and to maintain the liquid-permeable seal. Such membranes having, for example, a microporous structure may allow air and gases to pass through freely, so pressures are equalized and moisture diffused, while the pores of the membrane block the entry of liquids, as well as fine dust and particulates. However, conventional approaches to arranging and fixing such membranes, for example by means of an adhesive bead around the pressure-relief aperture have been found to be insufficient to maintain the desirable IP 6K6K rating.

Therefore, there is need for an electronics enclosure, in particular for electronics modules used in automotive applications, which is better able to resist liquid ingress while permitting for relief of pressure from within the enclosure.

SUMMARY OF THE DISCLOSURE

According to a first aspect of the disclosure, there is provided an enclosure for electronics. The enclosure comprises a shell. The shell defines an exterior of the enclosure. The shell accommodates a main chamber inside the shell. The enclosure also comprises a partition. The partition defines a relief chamber. The relief chamber extends inwardly of the shell. The partition has a relief aperture. The relief aperture communicates between the relief chamber and the main chamber. The enclosure comprises a gas-permeable barrier membrane. The barrier membrane is arranged to cover the aperture. The shell has an opening communicating between the relief chamber and the exterior of the enclosure.

In one configuration, a through-axis of the opening may laterally and/or angularly be offset from a through-axis of the aperture.

In one configuration, the partition may have a wall portion that projects inwardly from the shell and a roof portion extending from the wall portion to enclose the relief chamber. The roof portion may have the aperture.

In one configuration, the enclosure further comprises a tunnel structure providing a tunnel extending between the opening and the relief chamber.

In one configuration, the tunnel may extend in a straight line.

In one configuration, the tunnel may extend in a direction at an angle to a through-axis of the aperture.

In one configuration, the tunnel may extend in a direction perpendicular to a through-axis of the aperture.

In one configuration, the shell may have a second opening communicating between the relief chamber and the exterior of the enclosure.

In one configuration, a through-axis of the opening may be laterally and/or angularly offset from a through-axis of the aperture.

In one configuration, the through-axis of the second opening may be perpendicular to a through-axis of the opening and perpendicular to a through-axis of the aperture.

In one configuration, the gas-permeable membrane may be arranged on a main-chamber side of the partition.

In one configuration, the shell is a box-shaped shell, having a box-shape with planar top and bottom walls, and planar sidewalls extending between the top and bottom walls.

In one configuration, the partition may extend inwardly from a top or bottom wall of the box, and the opening may be provided in a sidewall of the box.

In one configuration, a rating of the enclosure meets IP 6K6K according to IEC standard 60529.

In one configuration, the enclosure is an enclosure for vehicle-mounted radar sensor electronics.

BRIEF DESCRIPTION OF THE DRAWINGS

For a better understanding of the present disclosure and to show how the same may be carried into effect, reference will be made, by way of example only, to the accompanying drawings, in which.

DETAILED DESCRIPTION

Figure 1:
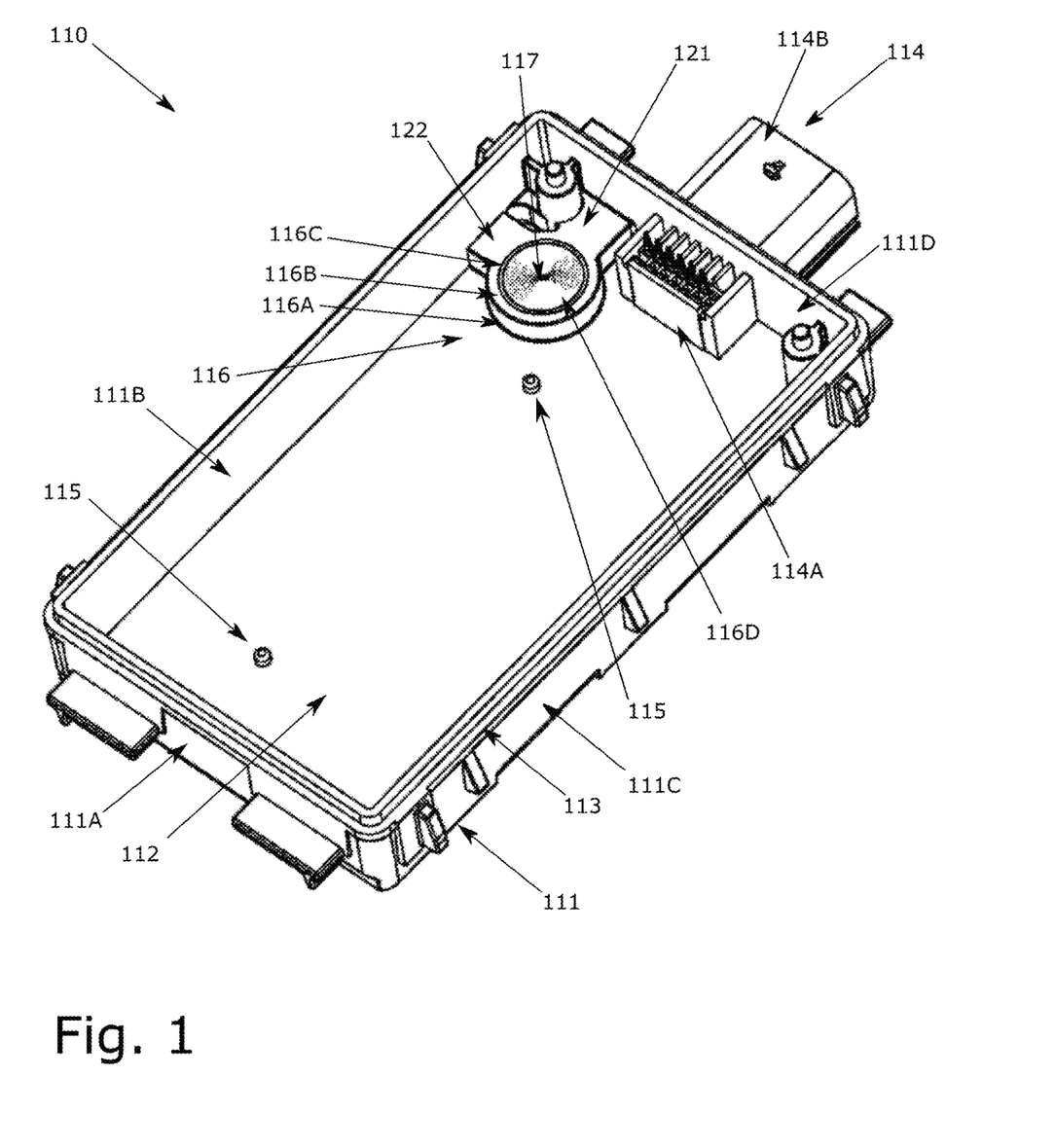
FIG. 1 shows an interior of a lower part of an enclosure according to an embodiment.
Figure 11:
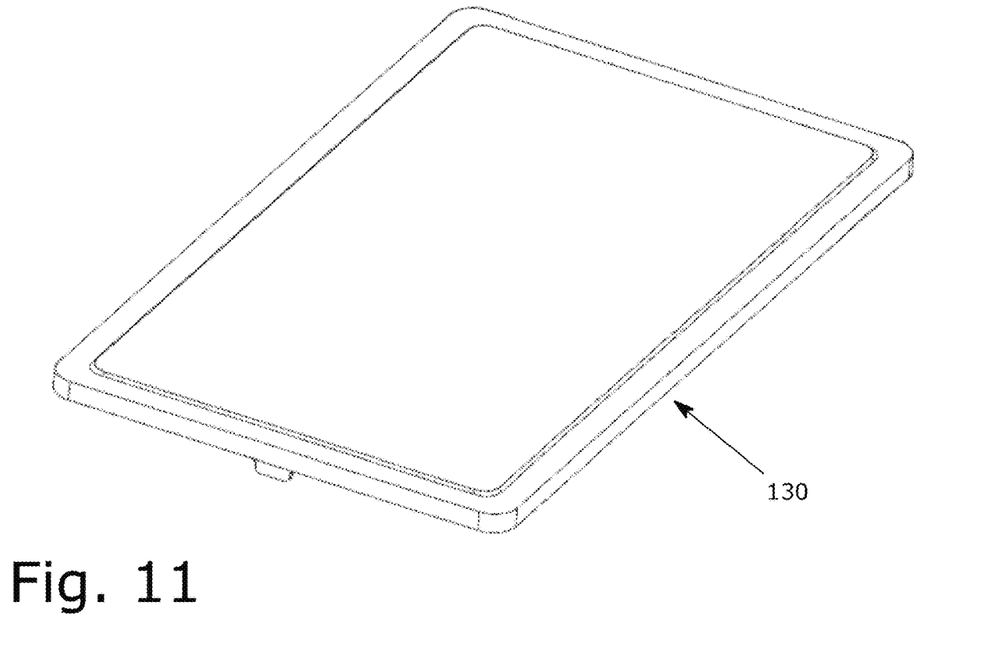
FIG. 11 shows an upper part usable as part of any of the disclosed embodiments.
Figure 12:
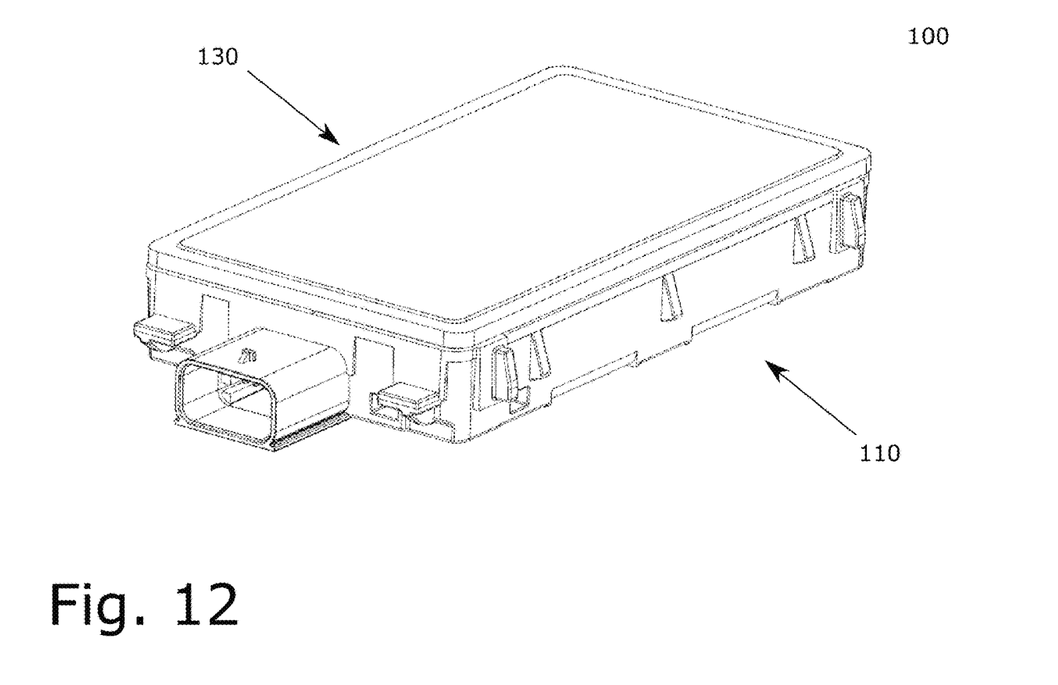
FIG. 12 shows the upper part of FIG. 11 engaged with the lower part of FIG. 1.

FIG. 1 shows a lower part 110 of an electronics enclosure 100. Electronics enclosure 100 has an upper part 130 shown in FIG. 11, having the form of a lid, which is configured to sealingly engage with lower part 110 to form the complete enclosure, as shown in FIG. 12. Lower part 110 in the configuration shown in FIG. 1 has the form of a rectangular box having a generally planar lower wall 111, generally planar sidewalls 111A, 111B, 111C, and 111D, which project vertically upwards from the plane of lower wall 111 so that an interior space 112 of enclosure 100 is partly enclosed on five sides.

The upper end of each of sidewalls 111A, 111B, 111C, and 111D is recessed on an outer edge to provide a sealing rim over which the upper part 130 can sealingly engage. The upper part 130 has a corresponding projection formed on a lower surface thereof to be accommodated in recess 113, and may provide space for a seal, such as an O-ring seal or a bead of sealant, to be located between the lower part 110 and the upper part 130. The upper part 130 may, for example, be secured to lower part 110 by adhesive, or may be provided with fixtures such as locking clamps or screws to engage the upper part 130 to the lower part 110. The upper part 130 may be a generally flat structure as shown, or may itself partly enclosed interior space 112, for example by having a corresponding shape to the shape of the lower part 110 with an upper wall and sidewalls which continue, in the assembled state, from the sidewalls 111A, 111B, 111C and 111D of lower part 110.

As shown in FIG. 1, one of the sidewalls 111D is provided with connector assembly 114, which provides an internal terminal portion 114A a having conductors which extend through sidewall 111D to receptacle 114B. The conductors of terminal portion 114 a pass through sidewall 111D by means of appropriate sealing, for example by being in sealing contact with the material of sidewall 11D, or otherwise by passing through a seal block such as a rubber block which itself seals with sidewall 111D. Thereby, external electrical signals may be introduced to and obtained from electronics mounted at the interior of enclosure 100 while maintaining a sealed state of enclosure 100.

Also provided in enclosure 100 are fixing points 115 which provide anchors for attaching, for example, an electronic component such as a printed circuit board (PCB). In the configuration of FIG. 1, fixing points 115 extend from an interior surface of lower wall 111, but may also be provided at other locations such as on each of sidewalls 111A, 111B, 111C, 111D. For example, fixing points 115 may be reinforced portions having a blind hole formed therein, into which a screw may be tapped. Arranging suitable holes in the electronic component over fixing points 115 and introducing a screw through the hole to the fixing point may be used to secure the electronic component. However, other means of securing electronic components within enclosure 100 may be provided by, for example, the use of adhesives, press-fit studs, retention clips or other fixtures.

When upper part 130 is sealingly engaged with lower part 110 of enclosure 100, there is a need for pressure relief for air (or other gas) which may be present in space 112 inside enclosure 100 to avoid pressure difference between an interior of the enclosure and an exterior of the enclosure from damaging the enclosure or the components housed therein. Accordingly, in the configuration of FIG. 1, an aperture 117 is provided communicating between the interior space 112 and a relief chamber 118, which itself communicates with an exterior of the enclosure 100. In the configuration of FIG. 1, aperture 117 is provided to a partition formed to extend from lower part 110 in the form of pedestal 116 which encloses the relief chamber 118. Relief chamber 118 communicates with the exterior of enclosure 100 through openings 119 and 120. Relief chamber 118 and openings 119 and 120 are not visible in FIG. 1 but are shown in the vertical cross-section of FIG. 2 and the horizontal cross-section of FIG. 3.

Figure 2:
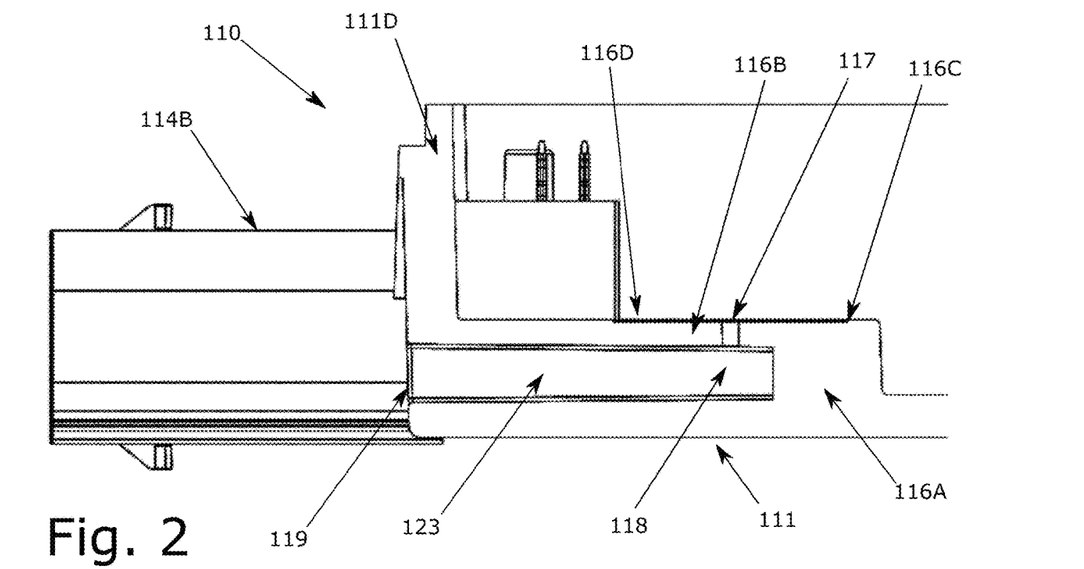
FIG. 2 shows a vertical cross-section through the lower part of FIG. 1.

As can be seen in FIG. 2, pedestal 116 has a wall portion 116A that extends vertically from the plane of lower wall 111 and a roof portion 116B that extends horizontally from wall portion 116A so as to enclose relief chamber 118. In the configuration shown in FIG. 1, roof portion 116B is circular in periphery and wall portion 116A extends circumferentially around the periphery of roof portion 116B. However, other configurations are possible, in which roof portion 116B may be, for example, domed, and/or wall portion 116A may be formed in a generally curved or in a polygonal shape, for example by a series of wall portions extending in a straight-line or curved configuration with angles defined therebetween. So, for example, pedestal 116 may, for example, be rectangular or hexagonal or octagonal outlined in a plane.

Figure 3:
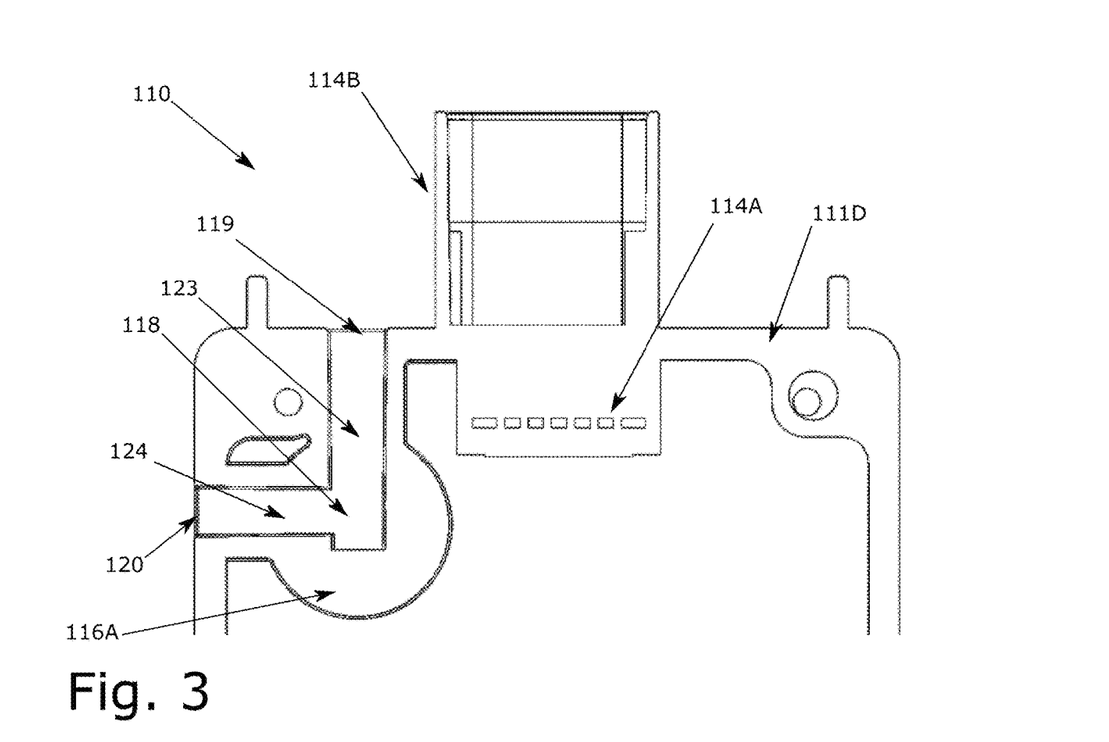
FIG. 3 shows a horizontal cross-section through the lower part of FIG. 1.
Figure 4:
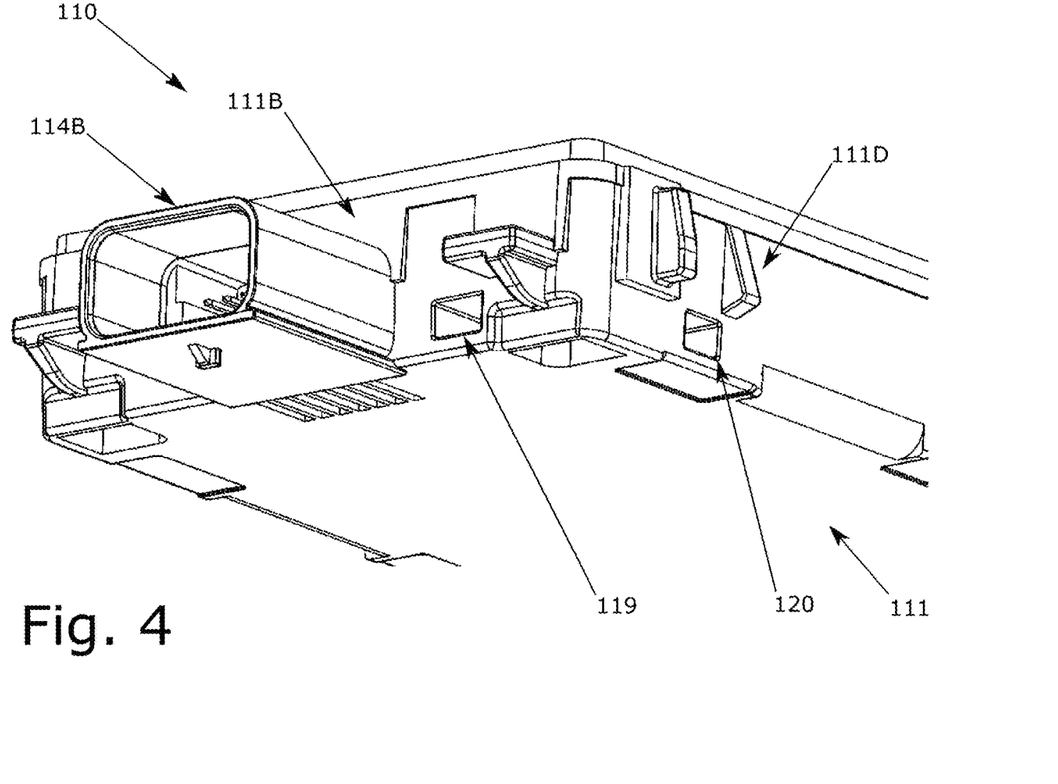
FIG. 4 shows a detail of an exterior of the lower part of FIG. 1.

Extending between pedestal 116 and adjacent sidewalls 111B and 111D are tunnel structures 121 and 122. As shown in FIG. 3, tunnel structures 121 and 122 define tunnels 123 and 124, which extend from relief chamber 118, and which respectively terminate at openings 119 and 120. FIG. 4 shows an alternative view of lower part 110 from an underside direction, in which lower surface 111 is visible, as well as openings 119 and 120 formed in respective sidewalls 111B and 111D.

In the configuration exemplified in FIG. 1, an overall passage for gas exists between space 112 and the exterior of the enclosure 100 through, sequentially, aperture 117, relief chamber 118, tunnels 123 and 124 and openings 119 and 120, whereby an overpressure or under-pressure inside enclosure 100 may be relieved.

To prevent ingress of moisture and/or dust into space 112 defined inside enclosure 100, membrane 116D is provided to cover aperture 117. Membrane 116D is gas-permeable but liquid-impermeable and may be formed of a breathable material such as GORE™ membrane. Such breathable materials known in the art and may be selected according to requirements.

In the configuration of FIG. 1, underside of membrane 116D is sealingly adhered by means of, for example, a peripheral adhesive bead to an upper surface of roof portion 116B so as to cover aperture 117. Membrane 116D thereby prevents ingress of moisture and/or dust between relief chamber 118 and space 112 through aperture 117. In the embodiment of FIG. 1, a recess 116C having the same size and shape as membrane 116D is formed on roof portion 116B to accommodate membrane 116D, but in other configurations membrane 116D may be affixed to a sufficiently flat surface of roof portion 116B without any recess. In the configuration of FIG. 1, recess 116C matches the peripheral shape of membrane 116D. However, there is no limitation on the pro shape of membrane 116D or recess 116C, and either or both of these may be circular, rectangular, octagonal, hexagonal, or of irregular outline.

By providing the configuration of FIG. 1, in which a relief chamber 118 is arranged between interior space 112 and an exterior of enclosure 100, communicating by means of aperture 117 and at least one of openings 119 and 120, the opportunity for an incident jet of liquid to impinge directly on membrane 116D is reduced. Therefore, the forces experienced by membrane 116D resulting from, for example, a cleaning process using liquid jets may be reduced. As a result, the seal provided by membrane may be more durable and the enclosure is made more resistant against incoming moisture.

In FIG. 1, a through-axis of aperture 117, which may be regarded as being a direction normal to a cross-section of aperture 117, is offset, both laterally and in angular direction, from each through-axis of openings 119 and 120. By offsetting the through-axes of openings 119 and/or 120 and aperture 117, a jet of liquid which is incident on enclosure 100 and aligned with opening 119 or 120 will not travel directly through aperture 117. Therefore, the force of the incident liquid on membrane 116D may be reduced, and the ability of membrane 116D to resist the incident liquid may be improved.

Additionally, by providing tunnels 123 and 124 extending from relief chamber 1182 and exterior of enclosure 100, the possibility for an incident jet of liquid to enclosure 100 can directly reach the aperture 117 is reduced. Similarly, by arranging aperture 117 in roof portion 116B of pedestal 116, possibility for an incident jet of liquid to reach aperture 117 may further be reduced. Thus, by such a configuration exemplified in of FIG. 1, there is no jet of liquid incident from outside enclosure 100 which can directly strike membrane 116D.

In the configuration of FIG. 1, two openings 119, 120, with associated tunnels 123, 124 are provided which communicate with relief chamber 118. Providing two such openings from the exterior of enclosure 100 allows for liquid, which has entered through one opening, easily to drain through the other opening. Accordingly, a jet of liquid through one opening will not lead to a build-up of liquid in relief chamber 118 and hence an undesirable increase of inward pressure against membrane 116D. By such a configuration, the ability of the enclosure to resist incident liquid can further be improved.

Moreover, in the configuration of FIG. 1, openings 119, 120 are arranged with through-axes which are angularly offset one to another. Specifically, in the configuration of FIG. 1, openings 119, 120 are located on different sidewalls, particularly adjacent sidewalls 111D, 111B. Here, adjacent sidewalls 111D, 111B extend at an inclination one to the other, shown as a perpendicular inclination. Such a configuration promotes more effective drainage of liquid from relief chamber 118. As shown in FIG. 1, providing the through-axes of openings 119, 120 to be perpendicular particularly efficiently promotes drainage, especially if the enclosure 100 may, in use, be installed at different orientations.

Also, in the configuration of FIG. 1, tunnels 123, 124 which terminate at openings 119, 120, extend at an angle one to another, and in particular are arranged to extend linearly in directions perpendicular one to another. Such a configuration permits the enclosure 100 to be installed in a variety of orientations and to retain the ability effectively to drain liquid which has entered into relief chamber 118 out from relief chamber 118 by the force of gravity. However, in other configurations, tunnels 123 and 124 need not be at right angles to one another and may be arranged at other angles. Moreover, although tunnels 123 and 124 are depicted as being formed in a straight line with a constant cross-section, in other configurations the cross-section can be narrowed or expanded along each tunnel. Further, the path of tunnels 123 and 124 may each be made curving or labyrinthine in order further to resist the incursion of liquid.

The above disclosure has been exemplified in one configuration shown in FIGS. 1 to 4, but many variations are possible without departing from the advantageous functionality and associated structure disclosed above. Reference will now be made to exemplary further variant embodiments shown respectively in FIGS. 5 to 6 and FIGS. 7 to 10. Where elements have not been described or labelled in connection these embodiments, is to be understood that like elements as disclosed in connection with the embodiment of FIG. 1 are present with corresponding structure and function.

Figure 5:
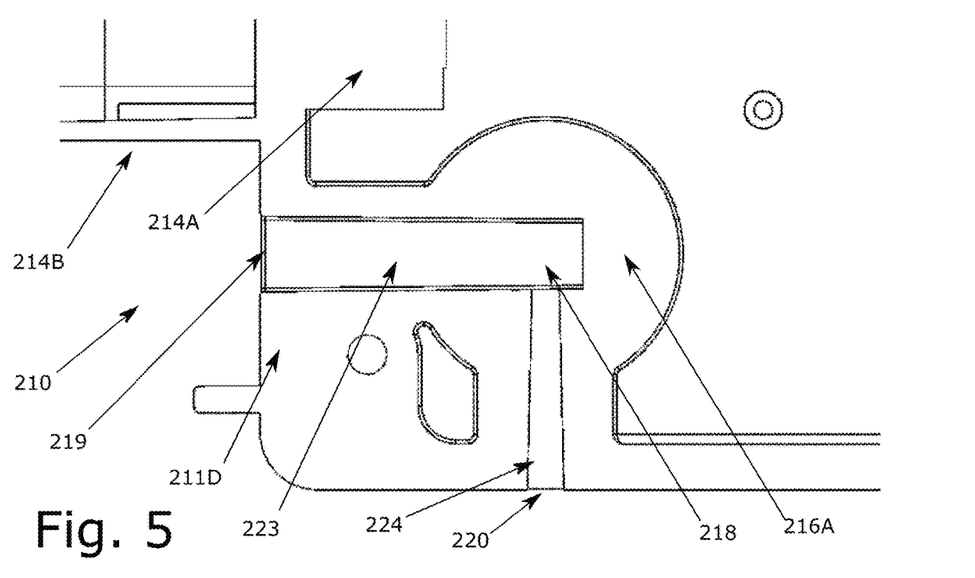
FIG. 5 shows a horizontal cross-section through a lower part of enclosure according to another embodiment.
Figure 6:
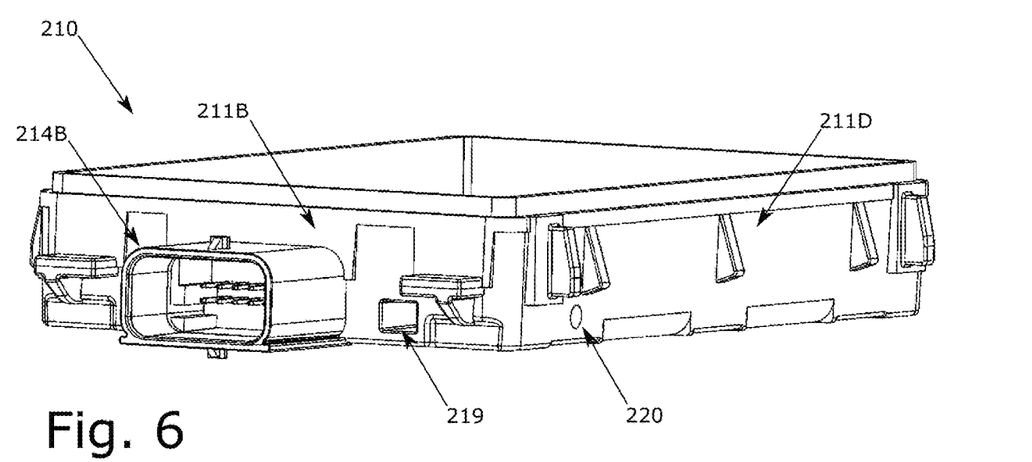
FIG. 6 shows an exterior of the lower part of FIG. 4.
Figure 7:
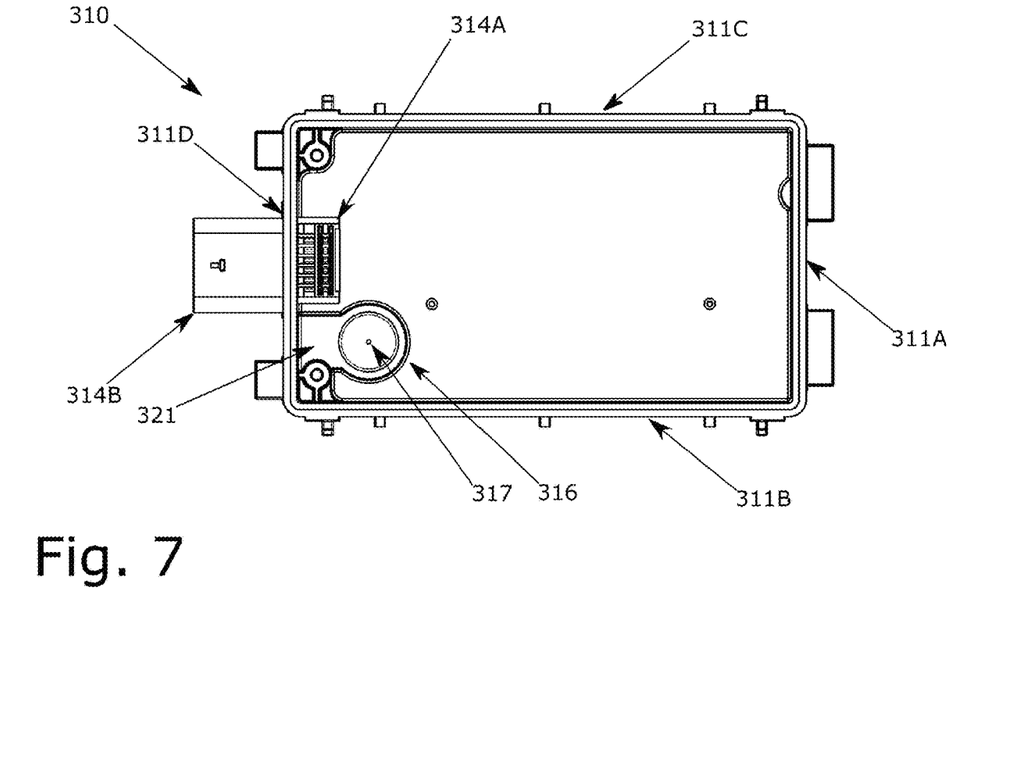
FIG. 7 shows an interior of the lower part of an enclosure according to another embodiment.
Figure 8:
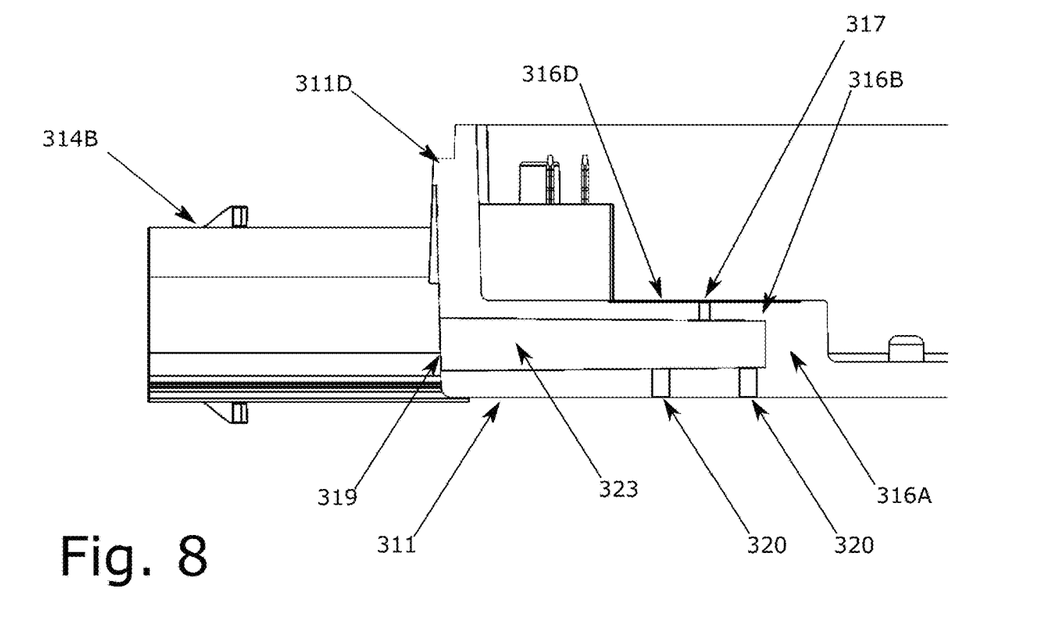
FIG. 8 shows a vertical-cross-section through the lower part of FIG. 7.
Figure 9:
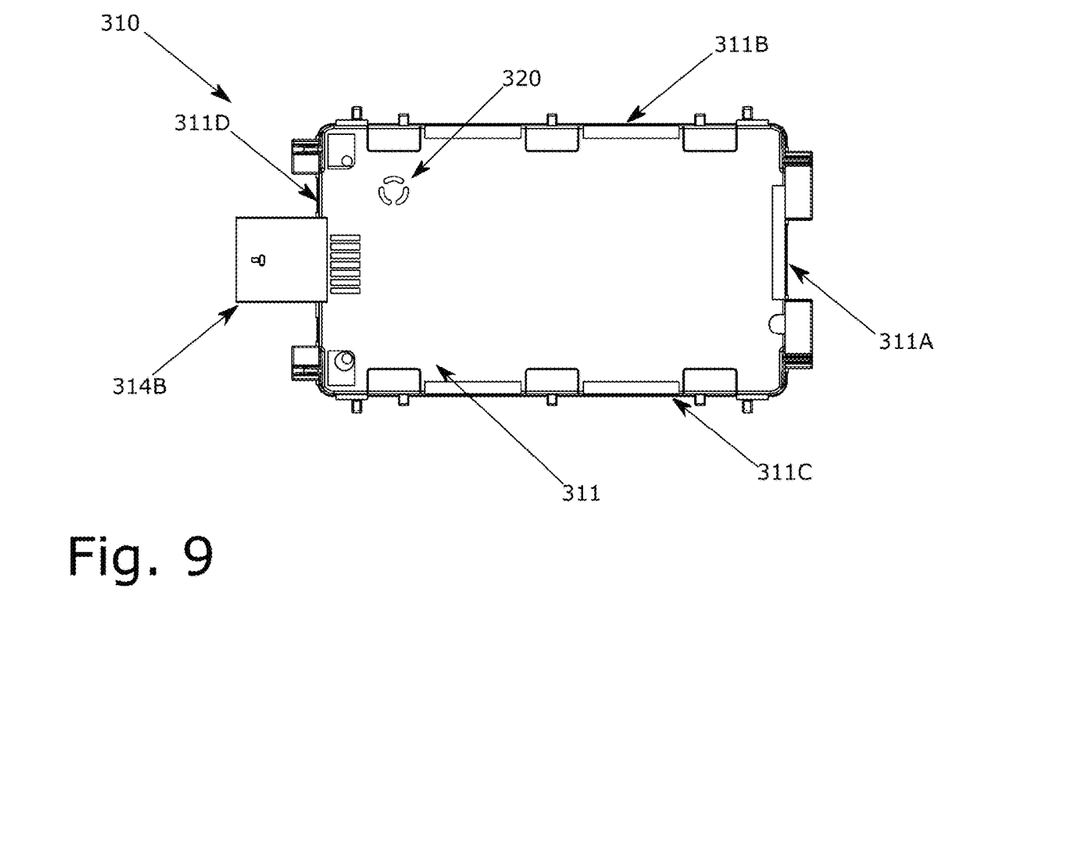
FIG. 9 shows an underside exterior of the lower part of FIG. 7.
Figure 10:
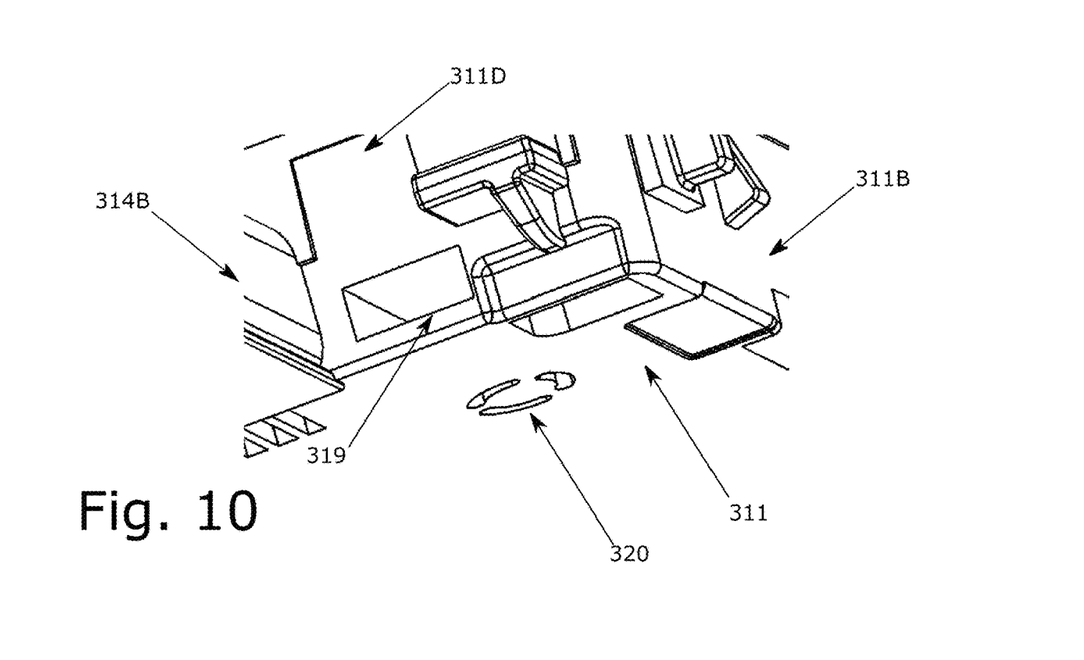
FIG. 10 shows a detail of the exterior of the lower part of FIG. 7.

For example, as shown in FIGS. 5 and 6, in a variant configuration, enclosure 310 may have a lower part 320 having openings 219 and 220. Openings 219 and 220, which terminate tunnels 223 and 224, may have different cross-sections. For example, as shown in FIGS. 5 and 6, the cross-section of tunnel 223 may be rectangular and may have constant dimensions, while the cross-section of tunnel 224 and associated opening 220 may be round and may taper, for example toward relief chamber 228. Other configurations of cross-section are possible, without limitation.

In another exemplary configuration, as shown in FIGS. 7 to 10, lower part 320 is provided with one opening 319 arranged at one sidewall 311D of enclosure 310 and connected to relief chamber 218 by tunnel 323. Lower part 320 is also provided with at least one second opening 220, here shown as a group of second openings 220, formed in lower surface 311 of lower part 320 and extending directly between lower surface 311 and relief chamber 328.

In such a configuration, aperture 317 formed in roof portion 316B of pedestal 316 may still be adequately protected from direct incidence of liquid jets since, for some applications, the enclosure may be mounted with openings 220 facing another surface, such as a surface to which lower part 320 is fixed and by which it is supported. Moreover, aperture 317 may be protected from direct incidence of liquid jets by arranging the one or more openings 220 with through-axes offset from a through-axis of aperture 117. In the configuration of FIGS. 7 to 10, openings 220 have through-axes which are laterally offset from a through-axis of aperture 317, for example.

In this way, systems, assemblies, and apparatus described herein meet IP6K6K according to IEC Standard 60529. For example, an example assembly is configured to meet IP6K6K according to IEC Standard 60529 and the assembly is configured to be mounted in a vehicle Additional or alternative protection against direct incidence of liquid jets also be provided by implementing each opening as a group of smaller holes, by covering each opening with a grid with sufficiently small mesh spacing, in each case so as to disrupt or reduce the force of any incident liquid jet.

Moreover, in the above disclosure has been made of a particular configuration which, having certain structural features, may exhibit certain functionality. However, as the skilled person will recognise, elements of the above-described structure may be modified or adapted or substituted by known equivalents without affecting the essential functionality.

For example, in the above embodiments, example has been used of an essentially rectangular box-shaped enclosure, but the present configuration is also applicable to box-type enclosures having outline in square, hexagonal, octagonal, or another polygonal shape.

Similarly, the present disclosure is applicable to enclosures which may have a circular outline, and which may have domed or otherwise non-planar upper and/or lower surfaces. For example, the present disclosure can be equivalently applied in a drum-like enclosure having a planar lower surface and a dome-shaped upper surface, and wherein openings are provided either to locations in the circumferential wall of the drum or on at one location on the circumferential wall of the drum and on a planar lower surface of the drum.

Moreover, the present disclosure is also applicable to configurations in which only one exterior opening is provided, or whether at a side surface or a lower surface, or another surface of the enclosure.

The above disclosure has been exemplified with respect to a two-part enclosure having a lower part and an upper part which sealingly engages with the lower portion as shown in FIG. 12. However, other configurations are possible, and the enclosure can be configured, for example, to have two lateral half-portions which each comprise an upper wall, lower wall and one or more sidewalls, and which are joined together at an open end of each lateral half-portion.

In a further configuration, no terminal portion and corresponding perceptible receptacle may be provided for communicating electrical signals between interior and exterior of the enclosure, and communication may be provided, for example, by wireless means.

Further, in connection with the above disclosure, each of the lower part of the enclosure and the upper part of the enclosure have each been shown as integral, unitary structures which may each be formed, for example, by injection moulding. However, the respective parts of each of these structures may also be formed separately and then sealably joined together by any suitable means such as adhesive or welding. The material of the enclosure is not limited to specific manufacturing materials and may advantageously be manufactured from a plastic or ceramic material.

Also, in the above disclosure, it has been explained how a gas-permeable membrane may be sealingly adhered to an upper surface of a pedestal structure which defines a relief chamber; however, in other configurations a membrane may be also formed as an insert to a relief aperture or may be adhered to an inner surface of the relief chamber.

Moreover, although the relief aperture has been exemplified by a circular through-hole, the relief aperture may be formed with a variety of cross-sections and shapes.

Finally, although the above disclosure has been set out in relation to a generic enclosure, an embodiment of the disclosure may be implemented as an electronics module having the enclosure and a radar sensor accommodated in a space inside the enclosure, for example on a PCB implementing a radar sensor. The sensor may be fixed inside the enclosure and communicating with elements outside of the enclosure by electronic signals transmitted via the terminal portion. In such a configuration, the enclosure may be made of radar-transparent material.

Accordingly, the foregoing disclosure is to be being understood purely to be exemplary and illustrative of the principles and essential features of the disclosure. Substitution or variation of materials and mechanisms among those known to one skilled in the art is contemplated without affecting the essential principles of the configurations herein disclosed and their associated effects and advantages. Accordingly, the claimed scope is to be understood as limited solely by the appended claims, taking due account of any equivalents.

What is claimed is:

1. An enclosure for electronics, the enclosure comprising:
   a shell that defines an exterior of the enclosure and accommodates a main chamber inside the shell;
   a partition that defines a relief chamber that extends inwardly of the shell and has a relief aperture that communicates between the relief chamber and the main chamber; and
   a gas-permeable barrier membrane arranged to cover the relief aperture,
   wherein the shell has a first opening and a second opening that communicate between the relief chamber and the exterior of the enclosure, a through-axis of the second opening being laterally offset or angularly offset from a through-axis of the relief aperture.

2. The enclosure of claim 1, wherein a through-axis of the first opening is laterally offset or angularly offset from the through-axis of the relief aperture.

3. The enclosure of claim 1, wherein the partition comprises a wall portion that projects inwardly from the shell, and a roof portion that includes the relief aperture and that extends from the wall portion to enclose the relief chamber.

4. The enclosure of claim 1, further comprising a first tunnel and a second tunnel that each extends between the first opening and the second opening, respectively, and the relief chamber.

5. The enclosure of claim 4, wherein each of the first tunnel and the second tunnel extends in a straight line.

6. The enclosure of claim 4, wherein each of the first tunnel and the second tunnel extends in a direction at an angle relative to the through-axis of the relief aperture.

7. The enclosure of claim 6, wherein each of the first tunnel and the second tunnel extends in a direction perpendicular to the through-axis of the relief aperture.

8. The enclosure of claim 1, wherein the first opening and the second opening are arranged on adjacent sidewalls of the enclosure and communicate with the relief chamber by respective tunnels that extend at an angle to one another.

9. The enclosure of claim 2, wherein the through-axis of the second opening is perpendicular to the through-axis of the first opening and perpendicular to the through-axis of the relief aperture.

10. The enclosure of claim 1, wherein the gas-permeable barrier membrane is arranged on a main-chamber side of the partition.

11. The enclosure of claim 1, wherein the shell is a box-shaped shell that includes planar top and bottom walls and planar sidewalls that extend between the planar top and bottom walls.

12. The enclosure of claim 11, wherein:
the partition extends inwardly from one of the planar top and bottom walls of the box-shaped shell; and
the first opening is provided in one of the planar sidewalls of the box-shaped shell.

13. The enclosure of claim 1, wherein the enclosure meets IP6K6K according to IEC standard 60529.

14. The enclosure of claim 1, wherein the enclosure is configured for vehicle-mounted radar sensor electronics.

15. An assembly comprising:
an enclosure comprising:
a shell to define an exterior of the enclosure and to accommodate a main chamber inside the shell;
a partition to define a relief chamber that extends inwardly of the shell and has a relief aperture to communicate between the relief chamber and the main chamber; and
a gas-permeable barrier membrane arranged to cover the relief aperture,
wherein the shell has a first opening and a second opening to communicate between the relief chamber and the exterior of the enclosure, a through-axis of the second opening being laterally offset or angularly offset from a through-axis of the relief aperture;
radar sensor electronics arranged within the main chamber; and
a connector assembly connected to the radar sensor electronics that passes between the main chamber and the exterior of the enclosure.

16. The assembly of claim 15, wherein:
the through-axis of the second opening is perpendicular to a through-axis of the first opening and perpendicular to the through-axis of the relief aperture.

17. The assembly of claim 15, wherein:
the shell is a box-shaped shell;
the box-shaped shell has planar top and bottom walls;
the box-shaped shell has planar sidewalls that extend between the planar top and bottom walls;
the partition extends inwardly from one of the planar top and bottom walls of the box-shaped shell; and
the first opening is provided in one of the planar sidewalls of the box-shaped shell.

18. The assembly of claim 15, wherein the assembly meets IP6K6K according to IEC standard 60529.

19. The assembly of claim 15, wherein the assembly is configured to be mounted in a vehicle.

20. The assembly of claim 15, wherein the first opening and the second opening are arranged on adjacent sidewalls of the enclosure and communicate with the relief chamber by respective tunnels that extend at an angle to one another.

\* \* \* \* \*